(12) United States Patent
Chang et al.

(10) Patent No.: US 12,317,573 B2
(45) Date of Patent: May 27, 2025

(54) THIN FILM TRANSISTOR

(71) Applicant: AUO Corporation, Hsinchu (TW)

(72) Inventors: Kuo-Jui Chang, Hsinchu (TW);
Wen-Tai Chen, Hsinchu (TW);
Chi-Sheng Chiang, Hsinchu (TW);
Yu-Chuan Liao, Hsinchu (TW);
Chien-Sen Weng, Hsinchu (TW);
Ming-Wei Sun, Hsinchu (TW)

(73) Assignee: AUO Corporation, Hsinchu (TW)

( * ) Notice: Subject to any disclaimer, the term of this patent is extended or adjusted under 35 U.S.C. 154(b) by 315 days.

(21) Appl. No.: 18/073,484

(22) Filed: Dec. 1, 2022

(65) Prior Publication Data

US 2024/0136420 A1  Apr. 25, 2024
US 2024/0234535 A9  Jul. 11, 2024

(30) Foreign Application Priority Data

Oct. 25, 2022  (TW) .................................. 111140470

(51) Int. Cl.
*H01L 29/49* (2006.01)
*H01L 21/28* (2006.01)
(Continued)

(52) U.S. Cl.
CPC ..... *H10D 64/679* (2025.01); *H01L 21/28123* (2013.01); *H10D 30/0314* (2025.01);
(Continued)

(58) Field of Classification Search
CPC .......... H01L 29/4991; H01L 21/28123; H01L 29/42384; H01L 29/66757;
(Continued)

(56) References Cited

U.S. PATENT DOCUMENTS 7,282,423 B2 * 10/2007 Furukawa ........... H01L 29/1045
257/E29.054
2010/0327353 A1  12/2010 Shoji et al.
(Continued)

FOREIGN PATENT DOCUMENTS

CN  100373633  3/2008
CN  210607272  5/2020
TW  201925871  7/2019

*Primary Examiner* — Mohammed R Alam
(74) *Attorney, Agent, or Firm* — JCIPRNET

(57) ABSTRACT

A thin film transistor includes a substrate, a semiconductor layer, a gate insulating layer, a gate, a source and a drain. The semiconductor layer is located above the substrate. The gate insulating layer is located above the semiconductor layer. The gate is located above the gate insulating layer and overlapping with the semiconductor layer. The gate includes a first portion, a second portion and a third portion. The first portion is extending along the surface of the gate insulating layer and directly in contact with the gate insulating layer. The second portion is separated from the gate insulating layer. Taking the surface of the gate insulating layer as a reference, the top surface of the second portion is higher than the top surface of the first portion. The third portion connects the first portion to the second portion. The source and the drain are electrically connected to the semiconductor layer.

7 Claims, 6 Drawing Sheets

(51) Int. Cl.
*H10D 30/01* (2025.01)
*H10D 30/67* (2025.01)
*H10D 64/66* (2025.01)

(52) U.S. Cl.
CPC ..... *H10D 30/0321* (2025.01); *H10D 30/6715* (2025.01); *H10D 30/673* (2025.01); *H10D 30/6731* (2025.01); *H10D 30/6745* (2025.01)

(58) Field of Classification Search
CPC ......... H01L 29/78621; H01L 29/78675; H01L 29/4908; H10D 64/679; H10D 30/0314; H10D 30/0321; H10D 30/6715; H10D 30/673; H10D 30/6731; H10D 30/6745; H10D 30/6739
See application file for complete search history.

(56) References Cited

U.S. PATENT DOCUMENTS

| | | | |
|---|---|---|---|
| 2013/0020632 A1* | 1/2013 | Disney | H01L 29/0847 257/E21.409 |
| 2020/0365576 A1 | 11/2020 | Kim | |

* cited by examiner

THIN FILM TRANSISTOR

CROSS-REFERENCE TO RELATED APPLICATION

This application claims the priority benefit of Taiwan application serial no. 111140470, filed on Oct. 25, 2022. The entirety of the above-mentioned patent application is hereby incorporated by reference herein and made a part of this specification.

BACKGROUND

Technical Field

The present disclosure relates to a thin film transistor.

Description of Related Art

Generally speaking, electronic devices contain many active components. For example, a display device often contains many thin film transistors, and the thin film transistors are formed by depositing various thin films (e.g., semiconductor layers, metal layers, dielectric layers, etc.) on a substrate. In the display device, the thin film transistors can be disposed in pixel structures or in the driving circuit.

With the advancement of technology, the critical sizes of various process technologies are gradually shrinking. The distance between the gate and the semiconductor layer is getting smaller and smaller. Therefore, the electric field generated by the gate may easily affect the carriers in the semiconductor layers, thereby causing the performance of the thin film transistor to deteriorate.

SUMMARY

The invention provides a thin film transistor, which can improve the leakage problem caused by the vertical electric field.

At least one embodiment of the present invention provides a thin film transistor. The thin film transistor includes a substrate, a semiconductor layer, a gate insulating layer, a gate, a source and a drain. The semiconductor layer is located above the substrate. The gate insulating layer is located on the semiconductor layer. The gate is located above the gate insulating layer and overlapping with the semiconductor layer. The gate includes a first portion, a second portion and a third portion. The first portion is extending along a surface of the gate insulating layer and directly in contact with the gate insulating layer. The second portion is separated from the gate insulating layer. Taking the surface of the gate insulating layer as a reference, a top surface of the second portion is higher than a top surface of the first portion. The third portion connects the first portion to the second portion. The source and the drain are electrically connected to the semiconductor layer.

At least one embodiment of the present invention provides a thin film transistor. The thin film transistor includes a substrate, a semiconductor layer, a gate insulating layer, a gate, a source and a drain. The semiconductor layer is located above the substrate. The gate insulating layer is located on the semiconductor layer. The gate is located above the gate insulating layer and overlapping with the semiconductor layer. The first portion of the gate is directly in contact with the gate insulating layer, and a vacuum gap is between the second portion of the gate and the gate insulating layer. The source and the drain are electrically connected to the semiconductor layer.

DESCRIPTION OF THE EMBODIMENTS

Figure 1:
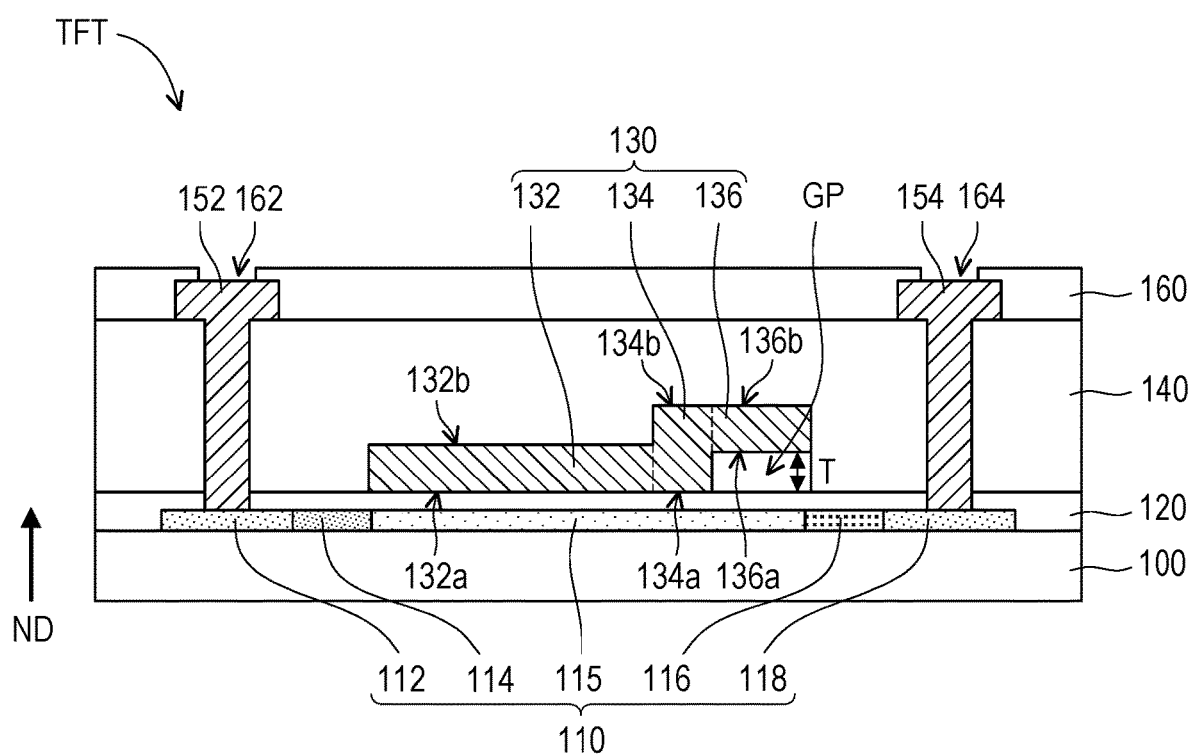
FIG. 1 is a schematic cross-sectional view of a thin film transistor according to an embodiment of the present invention.

FIG. 1 is a schematic cross-sectional view of a thin film transistor TFT according to an embodiment of the present invention. Referring to FIG. 1, the thin film transistor TFT includes a substrate 100, a semiconductor layer 110, a gate insulating layer 120, a gate 130, a source 152 and a drain 154. In some embodiments, the thin film transistor TFT further includes an interlayer dielectric layer 140 and a protective layer 160.

The material of the substrate 100 may be glass, quartz, organic polymer or opaque/reflective material (e.g., conductive material, metal, wafer, ceramic or other suitable materials) or other suitable materials. If a conductive material or metal is used, an insulating layer (not shown) is covered on the substrate 100 to avoid the short circuit problem.

The semiconductor layer 110 is located above the substrate 100. In this embodiment, the semiconductor layer 110 is directly formed on the substrate 100, but the invention is not limited thereto. In other embodiments, other insulating layers and/or light shielding layers are further included between the semiconductor layer 110 and the substrate 100.

The semiconductor layer 110 is a single-layer or multi-layer structure, and its material includes amorphous silicon, polysilicon, microcrystalline silicon, single crystal silicon, organic semiconductor materials, oxide semiconductor materials (for example, indium zinc oxide, indium gallium zinc oxide or other suitable materials, or a combination of the above) or other suitable materials or a combination of the above. In this embodiment, the semiconductor layer 110 is polysilicon for example.

The semiconductor layer 110 includes a drain region 118, a first lightly doped region 116, a channel region 115, a second lightly doped region 114 and a source region 112. The first lightly doped region 116 and the second lightly doped region 114 are respectively connected to two ends of the channel region 115. The first lightly doped region 116 is located between the drain region 118 and the channel region 115, and the second lightly doped region 114 is located between the source region 112 and the channel region 115.

In this embodiment, when the thin film transistor TFT is in an OFF state, the resistivity of the channel region 115 is greater than the resistivity of the first lightly doped region 116 and the second lightly doped region 114, and the resistivity of the first lightly doped region 116 and the second lightly doped region 114 is greater than that of the drain region 118 and the source region 112. For example, the drain region 118 and the source region 112 are doped to have a lower resistivity than the first lightly doped region 116 and the second lightly doped region 114, and the first lightly doped region 116 and the second lightly doped region 114 are doped to have a lower resistivity than the channel region 115. In some embodiments, both of the first lightly doped region 116, the second lightly doped region 114, the drain region 118 and the source region 112 are N-type semiconductors and have the same dopant, but the doping concentration of the drain region 118 and the source region 112 is greater than that of the first lightly doped region 116 and the second lightly doped region 114. In some embodiments, the resistivity of the first lightly doped region 116 is greater than the resistivity of the second lightly doped region 114. In other words, the doping concentration of the first lightly doped region 116 is smaller than that of the second lightly doped region 114.

The gate insulating layer 120 is located on the semiconductor layer 130 and covers the semiconductor layer 130. In some embodiments, the gate insulating layer 120 includes inorganic insulating materials (such as silicon oxide, silicon nitride, silicon oxynitride, hafnium oxide, aluminum oxide and etc.), organic insulating materials, or other suitable organic or inorganic high-k insulating materials.

The gate 130 is located above the gate insulating layer 120 and overlapping with the semiconductor layer 110 in the normal direction ND of the substrate 100. In this embodiment, the channel region 115 is overlapping with the gate 130 in the normal direction ND, while the first lightly doped region 116, the second lightly doped region 114, the drain region 118 and the source region 112 are not overlapping with the gate 130 in the normal direction ND.

In some embodiments, the gate 130 is a single-layer or multi-layer structure, and its material includes, for example, chromium, gold, silver, copper, tin, lead, hafnium, tungsten, molybdenum, neodymium, titanium, tantalum, aluminum, zinc, nickel, other metals, the alloy of the above, the oxides of the above metals, the nitrides of the above metal, or a combination of the above, or other conductive materials.

In this embodiment, the gate 130 includes a stepped structure. Specifically, the gate 130 includes a first portion 132, a second portion 136 and a third portion 134, and the first portion 132, the second portion 136 and the third portion 134 together form a stepped structure. The first portion 132 is extending along the surface of the gate insulating layer 120 and directly in contact with the gate insulating layer 120. Specifically, the bottom surface 132a of the first portion 132 is in contact with the gate insulating layer 120.

The second portion 136 is separated from the gate insulating layer 120. Specifically, the bottom surface 136a of the second portion 136 is separated from the gate insulating layer 120, and there is a vacuum gap GP between the bottom surface 136a of the second portion 136 and the gate insulating layer 120. In this embodiment, the pressure in the vacuum gap GP is less than 1 atmosphere, and the vacuum gap GP may be low vacuum, medium vacuum or high vacuum. In this embodiment, based on the surface of the gate insulating layer 120, the top surface 136b of the second portion 136 is higher than the top surface 132b of the first portion 132. In other words, the distance between the top surface 136b of the second portion 136 and the gate insulating layer 120 is greater than the distance between the top surface 132b of the first portion 132 and the gate insulating layer 120. In this embodiment, the drain region 118 is closer to the second portion 136 and the vacuum gap GP than the source region 112. In some embodiments, the thickness T of the vacuum gap GP is 20 nm to 150 nm.

The bottom surface 134a of the third portion 134 is in contact with the gate insulating layer 120, and the third portion 134 connects the first portion 132 to the second portion 136. In this embodiment, the third portion 134 is extending from the surface of the gate insulating layer 120 in a direction away from the gate insulating layer 120, so that the second portion 136 connecting the third portion 134 is away from the gate insulating layer 120. The top surface 134b of the third portion 134 is aligned with the top surface 136b of the second portion 136.

Based on the foregoing design, by keeping the second portion 136 away from the gate insulating layer 120, the vertical electric field between the gate 130 and the drain region 118 can be reduced, thereby improving the leakage current problem in the semiconductor layer 110.

The interlayer dielectric layer 140 is located on the gate insulating layer 120 and covers the first portion 132, the second portion 136 and the third portion 134 of the gate 130. The interlayer dielectric layer 140, the gate insulating layer 120 and the gate 130 surround the vacuum gap GP. More specifically, the interlayer dielectric layer 140, the gate insulating layer 120, the second portion 136 and the third portion 134 surround the vacuum gap GP. In some embodiments, the material of the interlayer dielectric layer 140 includes inorganic insulating materials (such as silicon oxide, silicon nitride, silicon oxynitride and etc.), organic insulating materials, or other suitable organic or inorganic low-k insulating materials. In this embodiment, the interlayer dielectric layer 140 is not filled between the second portion 136 and the gate insulating layer 120. However, in other embodiments, a portion of the interlayer dielectric layer 140 is filled between the second portion 136 and the gate insulating layer 120, so that the sidewall of the vacuum gap GP is retracted toward the third portion 134.

The source 152 and the drain 154 are located on the interlayer dielectric layer 140 and are electrically connected to the semiconductor layer 110. In this embodiment, the source 152 and the drain 154 are electrically connected to the source region 112 and the drain region 118, respectively. The second portion 136 and the vacuum gap GP are closer to the drain 154 than the first portion 132.

In some embodiments, each of the source 152 and the drain 154 is a single-layer or multi-layer structure, and the materials thereof include, for example, chromium, gold, silver, copper, tin, lead, hafnium, tungsten, molybdenum, neodymium, titanium, tantalum, aluminum, zinc, nickel, other metals, the alloy of the above, the oxides of the above metals, the nitrides of the above metal, or a combination of the above, or other conductive materials.

The protective layer 160 is located on the interlayer dielectric layer 140 and at least partially covers the source 152 and the drain 154. In this embodiment, the protective layer 160 has an opening 162 exposing the source 152 and an opening 164 exposing the drain 154, but the invention is not limited thereto. In other embodiments, the protective layer 160 completely covers the top surface of the source 152 and the top surface of the drain 154. In some embodiments, the material of the protective layer 160 includes inorganic insulating materials (such as silicon oxide, silicon nitride, silicon oxynitride and etc.), organic insulating materials, or other suitable organic or inorganic low-k insulating materials.

Figure 2A:
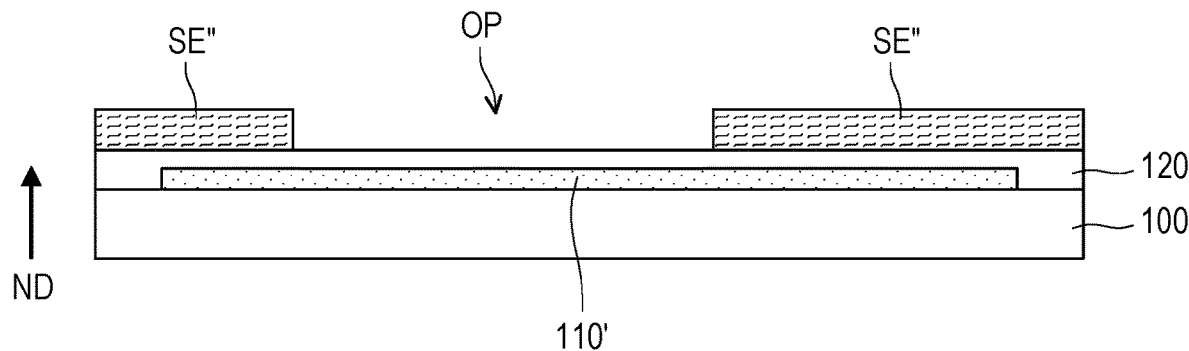
FIG. 2A to FIG. 2I are schematic cross-sectional views of the method for manufacturing the thin film transistor of FIG. 1.

FIG. 2A to FIG. 2I are schematic cross-sectional views of a method for manufacturing the thin film transistor TFT of FIG. 1. Referring to FIG. 2A, a semiconductor pattern 110' is formed on the substrate 100. A gate insulating layer 120 is formed on the semiconductor pattern 110'. A sacrificial pattern layer SE" is formed on the gate insulating layer 120. The sacrificial pattern layer SE" has an opening OP overlapping the semiconductor pattern 110'. In some embodiments, the material of the sacrificial pattern layer SE" includes indium tin oxide, other metal oxides, or other suitable inorganic, organic or metal sacrificial layer materials.

Figure 2B:
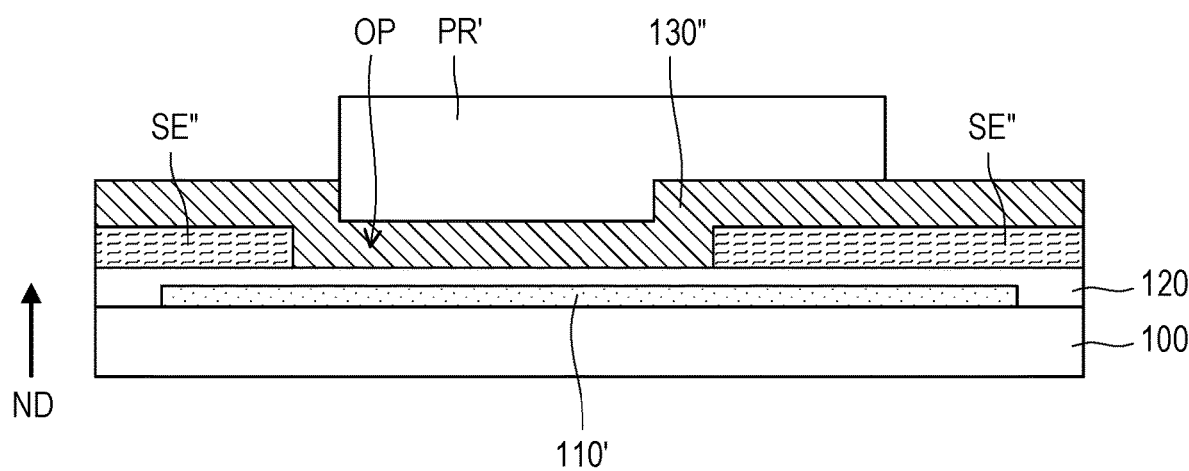

Referring to FIG. 2B, a gate material layer 130" is formed on the sacrificial pattern layer SE" and the gate insulating layer 120, and part of the gate material layer 130" is filled in the opening OP of the sacrificial pattern layer SE". A photoresist pattern layer PR' is formed on the gate material layer 130". The photoresist pattern layer PR' is overlapping with a part of the sacrificial pattern layer SE". The part of the sacrificial pattern layer SE" is located between the photoresist pattern layer PR' and the semiconductor pattern 110'.

Figure 2C:
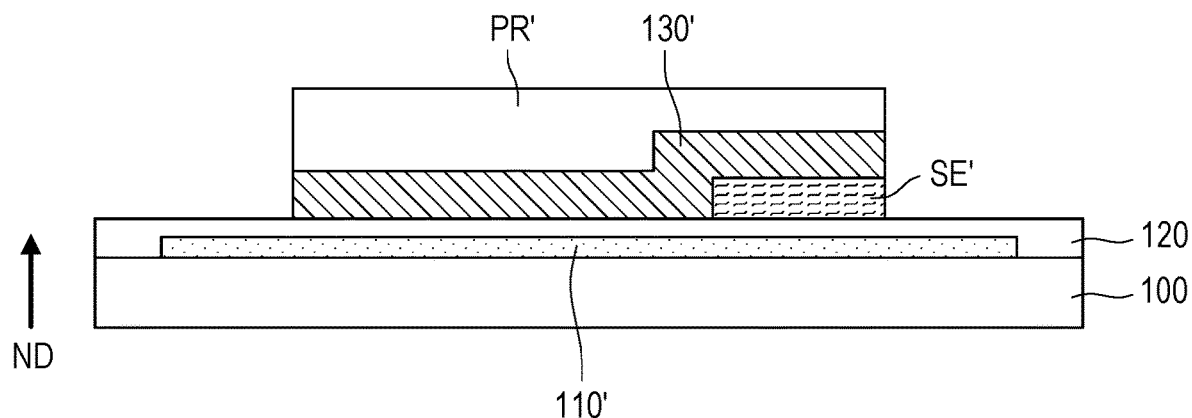

Referring to FIG. 2C, using the photoresist pattern layer PR' as a mask, the gate material layer 130" and the sacrificial pattern layer SE" are etched to form the gate pattern layer 130' and the sacrificial layer SE'. In this embodiment, the sacrificial pattern layer SE" can be used to protect the gate insulating layer 120 to reduce damage to the gate insulating layer 120 during the foregoing etching process. In this embodiment, the sacrificial layer SE' is located between the gate pattern layer 130' and the gate insulating layer 120, and is overlapping with a part of the semiconductor pattern 110'. The gate pattern layer 130' is extending from the surface of the gate insulating layer 120 to the top surface of the sacrificial layer SE' along the side surface of the sacrificial layer SE', so that the gate pattern layer 130' has a stepped structure.

Figure 2D:
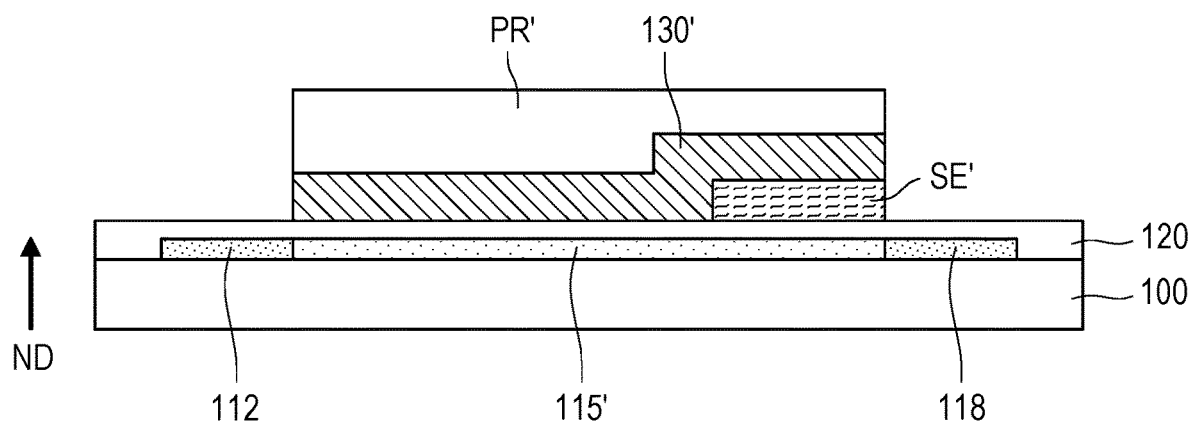

Referring to FIG. 2D, using the photoresist pattern layer PR', the gate pattern layer 130' and the sacrificial layer SE' as masks, a heavy doping process (e.g., an ion implantation process) is performed on the semiconductor pattern 110' to form a source region 112 and drain region 118. The semiconductor pattern 110' between the source region 112 and the drain region 118 is defined as a channel region 115'.

Figure 2E:
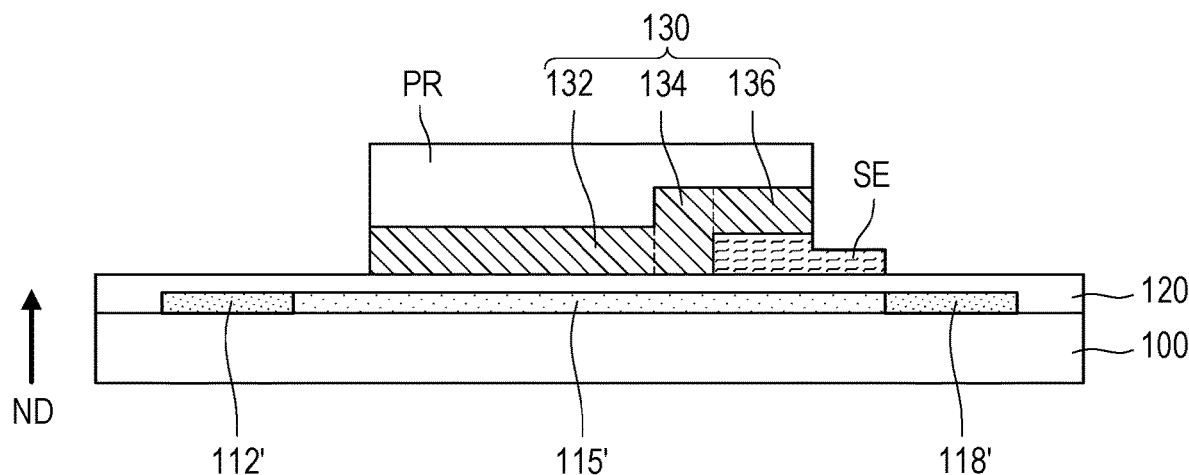

Referring to FIG. 2E, an etching process is performed again to remove a part of the photoresist pattern layer PR', a part of the gate pattern layer 130' and a part of the sacrificial layer SE' to form the photoresist pattern layer PR, the gate 130 and the sacrificial layer SE. The gate 130 includes a first portion 132, a second portion 136 and a third portion 134, wherein the third portion 134 is in contact with the sidewall of the sacrificial layer SE, and the second portion 136 is in contact with the top surface of the sacrificial layer SE.

In this embodiment, the sidewall of the photoresist pattern layer PR and the sidewall of the gate 130 are retracted during the etching process, so that a part of the channel region 115' is not overlapping with the sidewall of the photoresist pattern layer PR and the gate 130 in the normal direction ND.

In this embodiment, a part of the sacrificial layer SE is exposed by the gate 130 and the photoresist pattern layer PR after the aforementioned etching process.

Figure 2F:
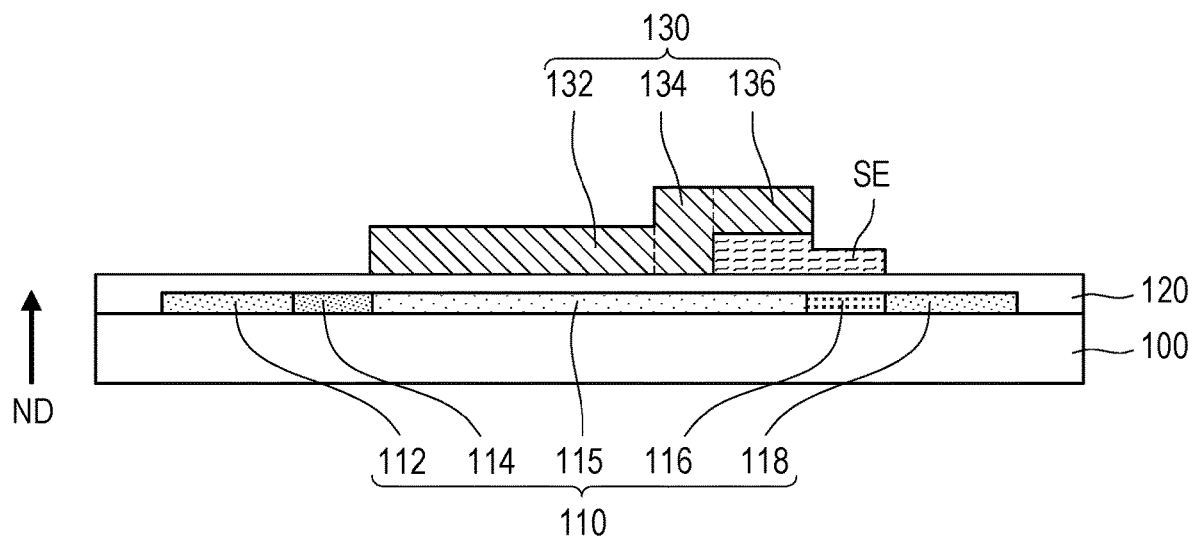

Referring to FIG. 2F, using the gate 130 and the sacrificial layer SE as masks, a light doping process (e.g., an ion implantation process) is performed on the source region 112, the drain region 118 and the channel region 115' to form a first lightly doped region 116 and the second lightly doped region 114, and a channel region 115 between the first lightly doped region 116 and the second lightly doped region 114 is defined. In this embodiment, since the sacrificial layer SE is overlapping with the first lightly doped region 116 in the normal direction ND, the sacrificial layer SE will block dopants from entering the first lightly doped region 116, such that the doping concentration of the first lightly doped region 116 is lower than that of the second lightly doped region 114. In some embodiments, the dopant dose of the first lightly doped region 116 is 1/3~3/4 of the dopant dose of the second lightly doped region 114.

Figure 2G:
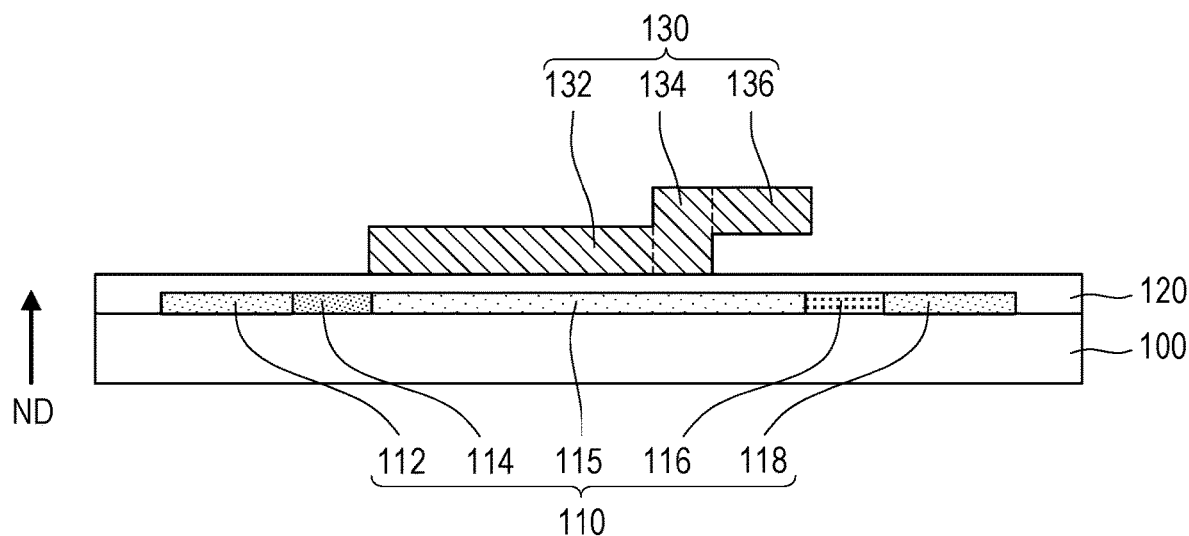

Referring to FIG. 2G, the sacrificial layer SE is removed. For example, the sacrificial layer SE is removed by an etching process.

Figure 2H:
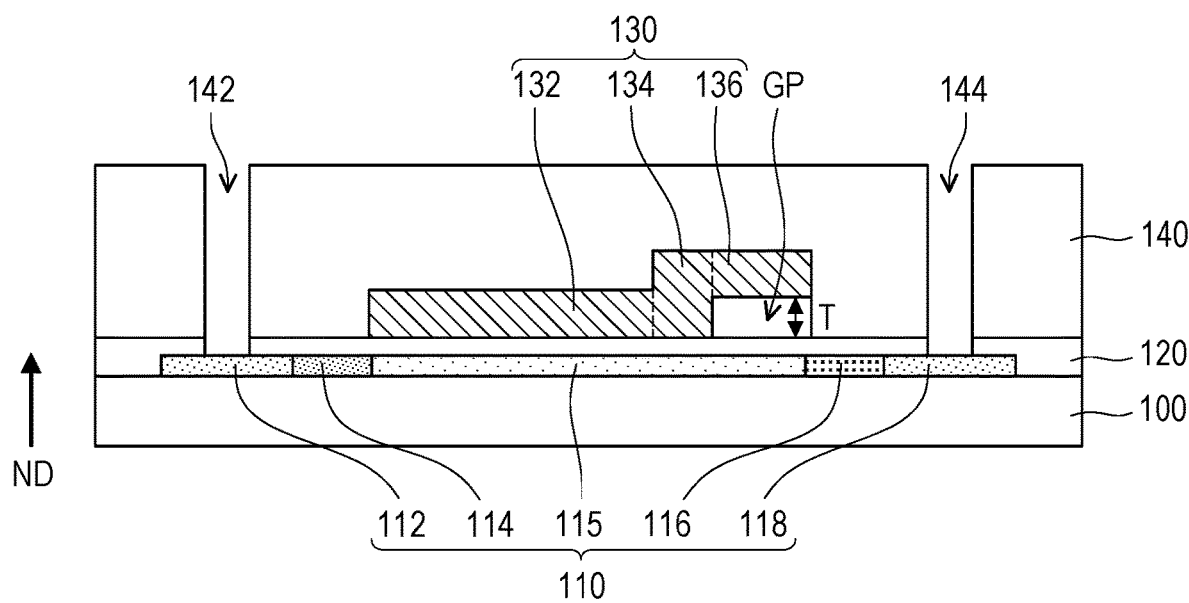

Referring to FIG. 2H, an interlayer dielectric layer 140 is formed on the gate insulating layer 120 and the gate 130. In this embodiment, after forming the interlayer dielectric layer 140, a patterning process is performed on the interlayer dielectric layer 140 and the gate insulating layer 120 to form an opening 142 exposing the source region 112 and an opening 144 exposing the drain region 118.

Figure 2I:
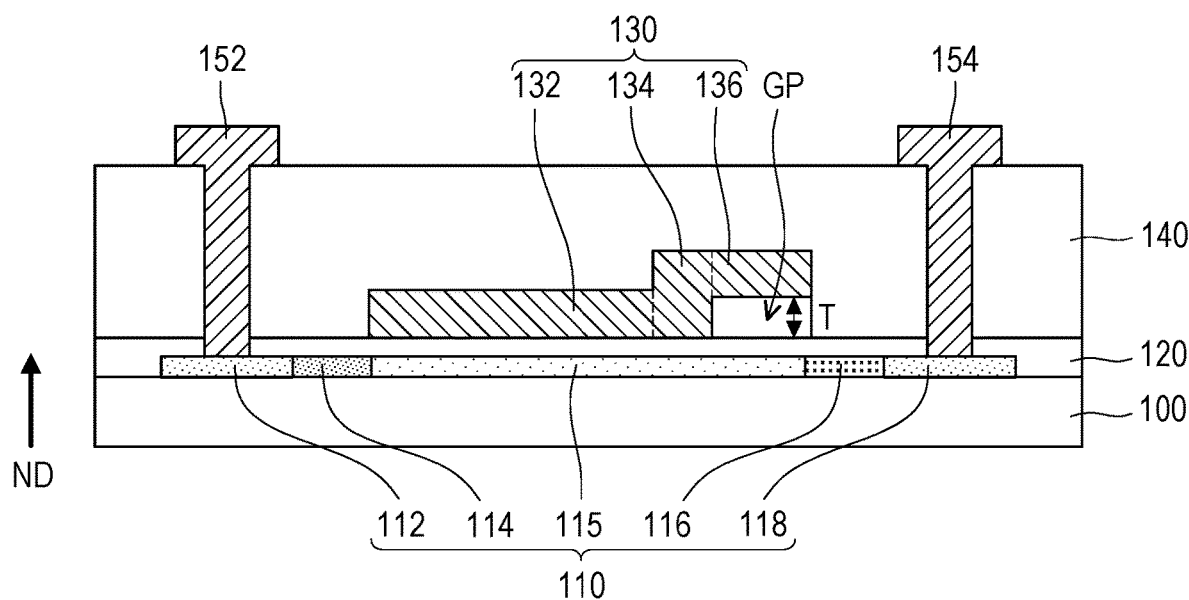

Referring to FIG. 2I, a source 152 and a drain 154 are formed on the interlayer dielectric layer 140, wherein the source 152 is filled in the opening 142 and in contact with the source region 112, and the drain 154 is filled in the opening 144 and in contact with the drain region 118.

Finally, returning to FIG. 1, a protective layer 160 is formed on the source 152 and the drain 154.

Base on the above, in the thin film transistor of the present invention, the second portion of the gate is separated from the gate insulating layer, thereby increasing the vertical distance between the gate and the drain region, thereby improving the leakage problem caused by the vertical electric field current.

What is claimed is:
1. A thin film transistor, comprising:
a substrate;
a semiconductor layer located above the substrate, wherein a channel region, a first lightly doped region, a second lightly doped region, a source region and a drain region constitute the semiconductor layer, wherein the first lightly doped region and the second lightly doped region are respectively connected to two ends of the channel region, wherein the first lightly doped region is connected between the drain region and the channel region, wherein the second lightly doped region is connected between the source region and the channel region;
a gate insulating layer located on the semiconductor layer and covering a side surface of the source region and a side surface of the drain region;
a gate located above the gate insulating layer and overlapping with the channel region of the semiconductor layer and not overlapping with the first lightly doped region, the second lightly doped region, the source region and the drain region of the semiconductor layer, wherein a first portion, a second portion and a third portion constitute the gate,
wherein the first portion extends from above an interface formed between the second lightly doped region and the channel region to the third portion, and wherein the first portion is directly contacted with the gate insulating layer;
wherein the drain region is closer to the second portion than the source region, and a vacuum gap is formed between the second portion and the gate insulating layer so that based on a surface of the gate insulating layer, a top surface of the second portion is higher than a top surface of the first portion; and
a source and a drain electrically connected to the source region and the drain region of the semiconductor layer, respectively.
2. The thin film transistor according to claim 1, wherein the channel region is overlapping with the gate in a normal direction of the substrate.

3. The thin film transistor according to claim 1, wherein a doping concentration of the first lightly doped region is less than a doping concentration of the second lightly doped region.

4. The thin film transistor according to claim 1, wherein the second portion is closer to the drain than the first portion.

5. The thin film transistor according to claim 1, wherein the first portion, the second portion and the third portion together form a stepped structure.

6. The thin film transistor according to claim 1, wherein a bottom surface of the first portion and a bottom surface of the third portion are in contact with the gate insulating layer, and a bottom surface of the second portion is separated from the gate insulating layer.

7. The thin film transistor according to claim 1, further comprising:
- an interlayer dielectric layer covering the first portion, the second portion and the third portion, wherein the source and the drain are located on the interlayer dielectric layer, wherein the interlayer dielectric layer, the gate insulating layer and the gate surround the vacuum gap.

* * * * *